United States Patent
Takewaki

(12) 
(10) Patent No.: US 6,391,774 B1
(45) Date of Patent: May 21, 2002

(54) FABRICATION PROCESS OF SEMICONDUCTOR DEVICE

(75) Inventor: Toshiyuki Takewaki, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/553,315

(22) Filed: Apr. 20, 2000

(30) Foreign Application Priority Data

Apr. 21, 1999 (JP) .......................................... 11-112999

(51) Int. Cl.⁷ .......................................... H01L 21/4763
(52) U.S. Cl. ...................... 438/687; 438/584; 438/621; 438/625; 438/627; 438/648; 438/678; 438/680; 438/683
(58) Field of Search ................................ 438/584, 621, 438/625, 627, 648, 678, 680, 687, 683

(56) References Cited

U.S. PATENT DOCUMENTS 6,207,558 B1 * 3/2001 Singhvi et al. ............. 438/648

FOREIGN PATENT DOCUMENTS

| JP | 3-68190 | 3/1991 |
| JP | 3-263896 | 11/1991 |
| JP | 7-115073 | 5/1995 |
| JP | 7-201853 | 8/1995 |
| JP | 9-306912 | 11/1997 |
| JP | 10-4139 | 1/1998 |

OTHER PUBLICATIONS

Takahisa Nitta, "Electrical Properties of Giant–Grain Copper Thin Films Formed by a Low Kinetic Energy Particle Process", Mar. 1992, pp. 922–927.

Takewaki et al., "Materials Chemistry and Physics", Mar. 1995, pp. 182–191.

Japanese Office Action dated Dec. 4, 2001 with partial English Translation.

T. Takewaki et al. "Formation of giant–grain copper interconnects by a low–energy ion bombardment process for high–speed ULSIs", Materials Chemistry and Physics 4 (1995) pp. 182–191.

* cited by examiner

Primary Examiner—Charles Bowers
Assistant Examiner—Lisa Kilday
(74) Attorney, Agent, or Firm—McGinn & Gibb, PLLC

(57) ABSTRACT

A fabrication process of a semiconductor device can bury Cu within a wiring groove and a grain is large. A fabrication process of a semiconductor device, in which wiring is formed on the semiconductor substrate, includes a first step of depositing a first conductive film on the substrate via an insulation film, a second step, subsequent to the first step, of depositing a second conductive film having film thickness thicker than the film thickness of the first conductive film, on the first conductive film, a third step following the second step, of performing heat treatment at least for the first and second conductive films, and a fourth step following the third step, of forming wiring by shaping the conductive films after the heat treatment.

15 Claims, 10 Drawing Sheets

12 Cu GROOVE WIRING HAVING GIANT GRAIN

31 PLASMA CVDCu

FABRICATION PROCESS OF SEMICONDUCTOR DEVICE

BACKGROUND OF THE INVENTION

1. Field of the Invention

The present invention relates generally to a fabrication process of a semiconductor device. More particularly, the invention relates to a fabrication process of a semiconductor device which has wiring and groove wiring of copper (Cu) formed on a semiconductor substrate.

2. Description of the Related Art

In the recent years, Cu is attracting attention as a material for forming wiring of a large scale integrated circuit (LSI) for increasing package density and speeding up. Furthermore, when Cu is used for the LSI wiring, since formation of wiring by dry etching is difficult. Therefore, a current major trend is a damascene wiring, in which a wiring groove is formed preliminarily, Cu is buried therein and polishing is performed for leaving Cu in the wiring groove. However, associating with increasing of package density of the LSI, the wiring groove is progressively narrowed to cause difficulty in burying Cu within the wiring groove by way of sputtering.

As a measure for this, an electrolytic plating method has been currently employed. Such electrolytic plating method has been disclosed in Japanese Unexamined Patent Publication No. Showa 63-164241. The disclosed technology uses the electrolytic plating method for burying Cu in a contact hole. This type of device have also been disclosed in Japanese Unexamined Patent Publication No. Heisei 3-68190 and Japanese Unexamined Patent Publication No. Heisei 3-263896, for example.

However, the Cu film deposited by the electrolytic plating method had small grain, and the Cu groove wiring formed using the Cu film formed by electrolytic plating has low electromigration resistance. Here, electromigration is a phenomenon to cause local thickening or thinning of the wiring due to motion of atom during application of electric power. In order to improve electromigration resistance, it becomes necessary to make the grain size greater so as not to leave grain boundary in the wiring.

On the other hand, using an RF-DC coupling bias sputtering method, a DC bias higher than or equal to a certain value is applied to the substrate deposit the Cu film with striking a sputter growth surface by argon ion. At this time, a film of (111) orientation as the highest density surface is deposited to reduce a distance between Cu atoms to accumulate stress energy within the film. When heat treatment is performed subsequently, the stress energy is discharged to change crystal orientation of the Cu film from Cu(111) to thermally stable Cu(200). At the same time, giant grain growth greater than or equal to several hundreds $\mu$m is caused in the Cu film. This has been reported in "Electrical Properties of Giant-Grain Copper Thin Film Formed by a Low Kinetic Energy Particle Process", J. Eelectrochem. Soc., Vol. 139, March, 1992, pp. 922–927 (hereinafter referred to as publication 1).

On the other hand, after depositing Cu by normal sputtering, Cu is deposited in two stages with applying the DC bias higher than or equal to the certain value. By subsequently performing heat treatment, a stress energy is transferred from the layer deposited with applying the DC bias to the layer deposited by normal sputtering to cause variation of the crystal orientation and grain growth in the entire film similarly to the foregoing publication 1. This has been reported in "Formation of giant-grain copper interconnects by a low-energy ion bombarment process for high speed ULSIs", Journal of Materials Chemistry and Physics, 99(1995), pp. 1–10 (hereinafter referred to as publication 2).

As set forth above, by sputter deposition with irradiating ion beam, Cu film having giant grain of several 100 $\mu$m can be formed. However, both sputtering methods are disadvantageous in comparison with the plating method in terms of burying in the wiring groove. Namely, even if the either sputtering method is employed, it is difficult to bury Cu within the wiring groove.

SUMMARY OF THE INVENTION

Therefore, it is an object of the present invention to provide a fabrication process of a semiconductor device which can bury Cu within a wiring groove and a grain is large.

According to one aspect of the present invention, a fabrication process of a semiconductor device, in which wiring is formed on the semiconductor substrate, comprises:

a first step of depositing a first conductive film on the substrate via an insulation film;

a second step, subsequent to the first step, of depositing a second conductive film having film thickness thicker than the film thickness of the first conductive film, on the first conductive film;

a third step following the second step, of performing heat treatment at least for the first and second conductive films; and a fourth step following the third step, of forming wiring by shaping the conductive films after the heat treatment.

In the construction set forth above, a groove for burying wiring is formed in the insulation film. In the alternative, a via hole is formed in the insulation film. In the preferred process, the first step comprises:

a first sub-step of depositing a first sub-layer by sputtering; and a second sub-step following the first sub-step of depositing a second sub-layer on the first sub-layer by an electrolytic plating, for forming the first conductive film with the first sub-layer and the second sub-layer.

The first conductive film may be deposited in the first step by plasma CVD.

In the preferred process, the second step comprises:

a first sub-step of sputtering and reducing oxide on a surface of the first conductive film; and a second sub-step following the first sub-step, of applying bias to the semiconductor substrate and irradiating argon gas onto a growth surface within a sputtering chamber. The third step may be performed a heat treatment at a given temperature and a given period under argon atmosphere. The fourth step is performed for forming a groove wiring by removing a conductive film other than wiring portion by a mechanical chemical polishing.

Preferably, the conductive film is formed by copper.

BRIEF DESCRIPTION OF THE DRAWINGS

The present invention will be understood more fully from the detailed description given hereinafter with reference to the accompanying drawings of the preferred embodiment of the present invention, which, however, should not be taken to be limitative to the present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structure are not shown in detail in order to avoid unnecessary obscurity of the present invention.

FIGS. 1 to 5 are sections showing the first embodiment of a fabrication process of a semiconductor device according to the present invention. On the other hand, FIGS. 10 to 14 are sections showing the second embodiment of a fabrication process of a semiconductor device according to the present invention.

Figure 1:
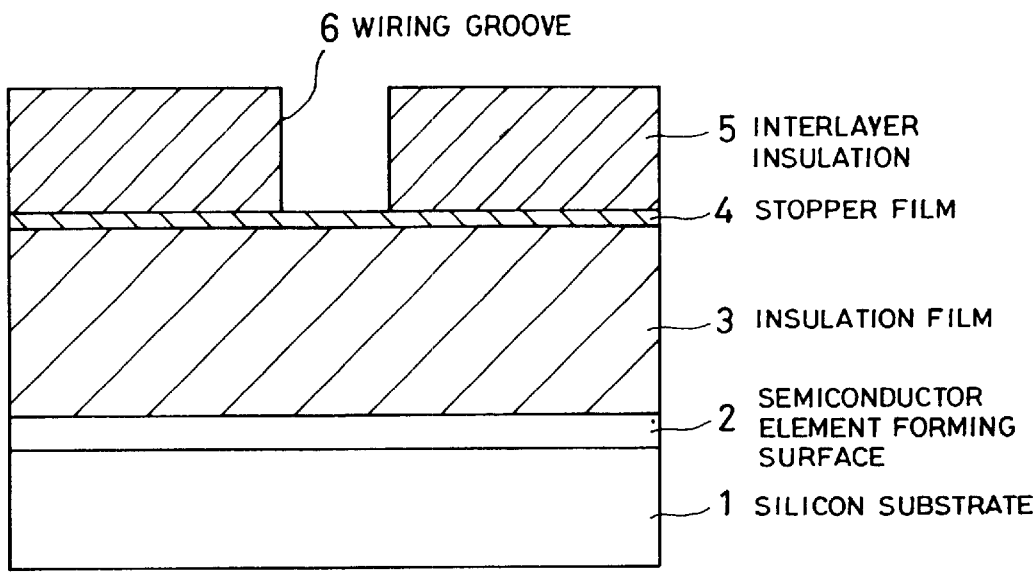
FIG. 1 is a section showing the first embodiment of a fabrication process of a semiconductor device according to the present invention.

At first, discussion will be given for the first embodiment of the fabrication process of the semiconductor device according to the present invention. The first embodiment shows the case where Cu is buried within the wiring groove. Referring to FIG. 1, a semiconductor element forming surface 2 is formed on a silicon substrate 1. An insulation film 3 is formed on the semiconductor element forming surface 2. A stopper film 4 is formed on the insulation film 3. An interlayer insulation film 5 is formed on the stopper film 4. A wiring groove 6 is formed in the interlayer insulation film 5.

Figure 2:
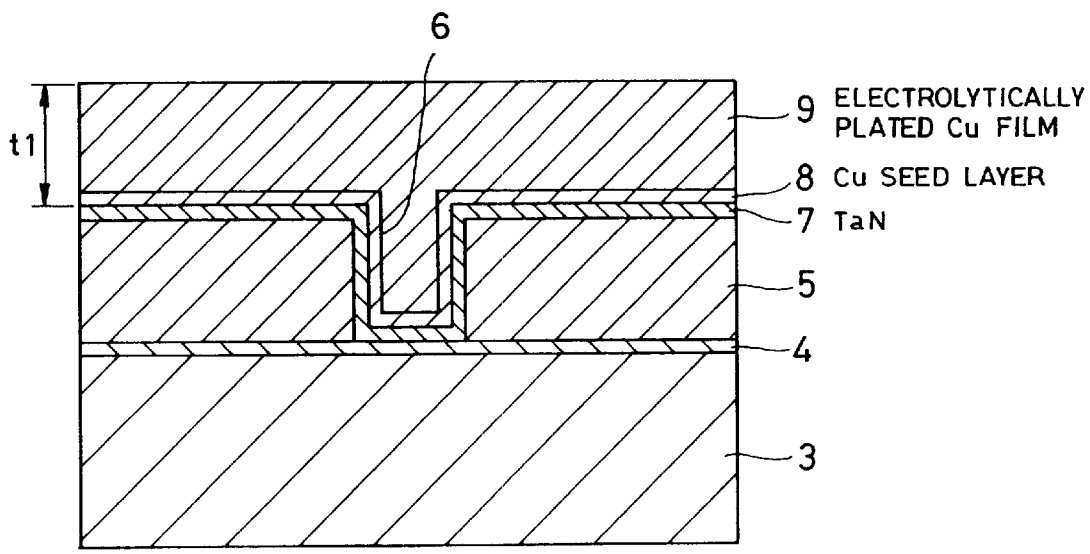
FIG. 2 is a section showing the first embodiment of a fabrication process of a semiconductor device according to the present invention.

Next, referring to FIG. 2, on an upper surface of the interlayer insulation film 5 and bottom surface and side surface of the wiring groove 6, a barrier layer 7, typically TaN (Ta: tantalum, N: nitrogen) is formed. A Cu seed layer 8 is formed on the barrier layer 7. On the Cu seed layer 8, an electrolytically plated Cu film 9 having (111) orientation is formed. A total film thickness of the Cu seed layer 8 and the electrolytically plated Cu film 9 is assumed to be t1. It should be noted that in FIGS. 2 to 5, detailed disclosure for the silicon substrate 1 and the semiconductor element forming surface 2 is omitted for the purpose of disclosure and for keeping the disclosure simple enough to facilitate clear understanding of the present invention.

Figure 3:
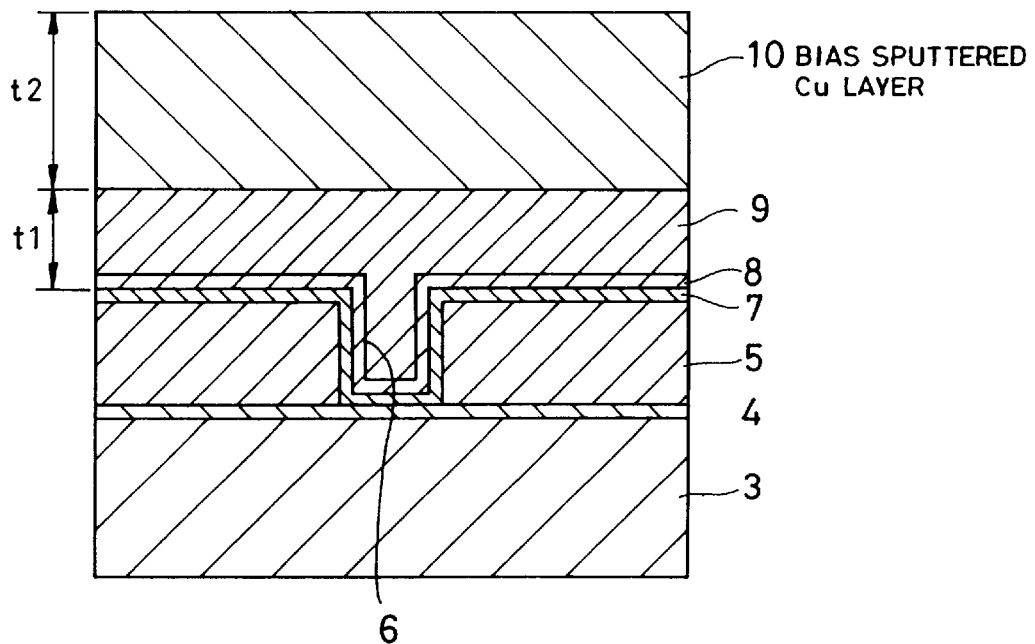
FIG. 3 is a section showing the first embodiment of a fabrication process of a semiconductor device according to the present invention.

Next, referring to FIG. 3, with applying an RF (high frequency) bias or a DC (direct current) bias to the silicon substrate 1 and irradiating an argon ion onto a sputter growth surface, a Cu (bias sputtered Cu layer) 10 is deposited in a film thickness of t2. The film thickness t2 is selected to be greater than t1 (t2>t1).

Figure 4:
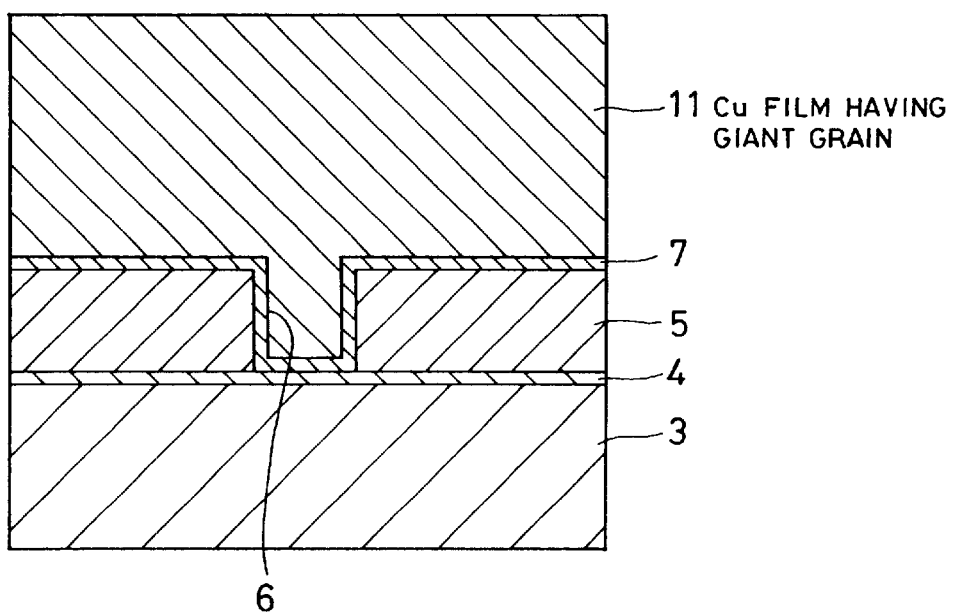
FIG. 4 is a section showing the first embodiment of a fabrication process of a semiconductor device according to the present invention.
Figure 5:
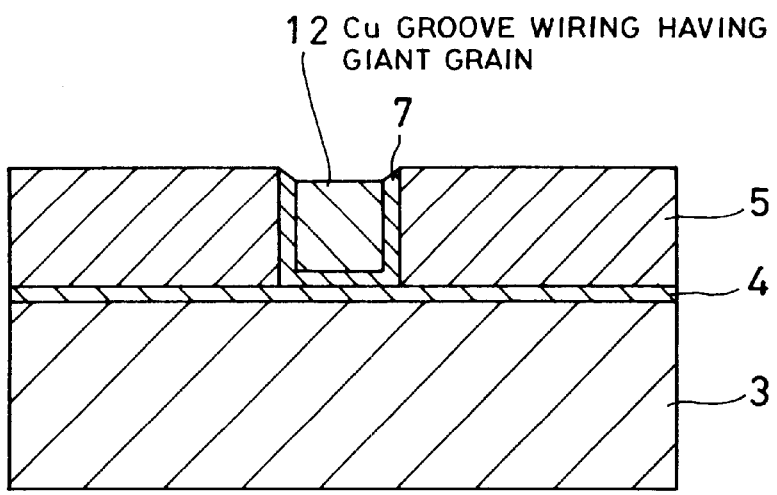
FIG. 5 is a section showing the first embodiment of a fabrication process of a semiconductor device according to the present invention.

Next, referring to FIG. 4, for crystal control, heat treatment is performed under argon (Ar) or nitrogen (N) atmosphere. At this time, crystal orientation is changed to Cu(200), and, at the same time, Cu film 11 having giant grain of several hundreds μm is formed. Next, referring to FIG. 5, by mechanical chemical polishing (CMP), Cu other than wiring portion is removed to form a Cu groove wiring 12.

Novel portion in the first embodiment set forth above, is to deposit Cu 10 having a film thickness greater than or equal to a plated film thickness with applying the RF or DC bias to the silicon substrate 1 and irradiating argon ion onto a sputter growth surface (see FIG. 3), after deposition of Cu 9 by electrolytic plating (see FIG. 2) and before performing heat treatment for crystal control (see FIG. 4).

Next, discussion will be given for the second embodiment of the fabrication process of the semiconductor device according to the present invention. The second embodiment shows the case where Cu is buried in a via hole. While the through hole is a hole through the entire thickness of a multiple layer substrate, the via hole is a hole formed between particular layers in the multiple layer substrate. It should be noted that in FIGS. 10 to 14, the same components common to those in FIGS. 1 to 5 will be identified by the same reference numerals and discussion for such common components will be omitted for avoiding redundant disclosure and keeping the disclosure simple enough to facilitate clear understanding of the present invention. Also, in FIGS. 11 to 14, disclosure of the substrate 1 and the semiconductor element forming surface 2 is omitted.

Figure 10:
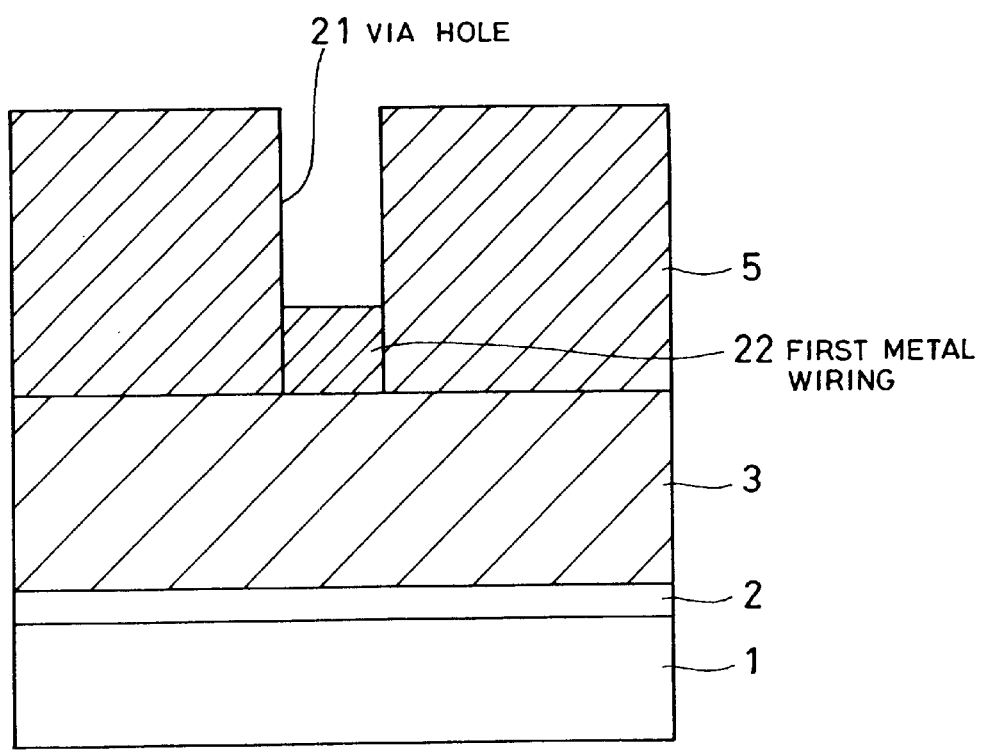
FIG. 10 is a section showing the second embodiment of a fabrication process of a semiconductor device according to the present invention.

Referring to FIG. 10, the semiconductor element forming surface 2 is formed on the silicon substrate 1. The insulation film 3 is formed on the semiconductor element forming surface 2. The interlayer insulation film 5 is formed on the insulation film 3. In the interlayer insulation film 5, a via hole 21 is formed. On the bottom surface of the via hole 21, a first metal wiring 22 is formed. Next, referring to FIG. 11, on the upper surface of the interlayer insulation film 5 and the bottom surface and the side surface of the wiring groove 6, the barrier layer 7, typically Ta, TaN, is formed. The Cu seed layer 8 is formed on the barrier layer 7. The electrolytically plated Cu film 9 having (111) orientation is formed on the Cu seed layer 8. A total film thickness of the Cu seed layer 8 and the electrolytically plated Cu film 9 is t5.

Figure 12:
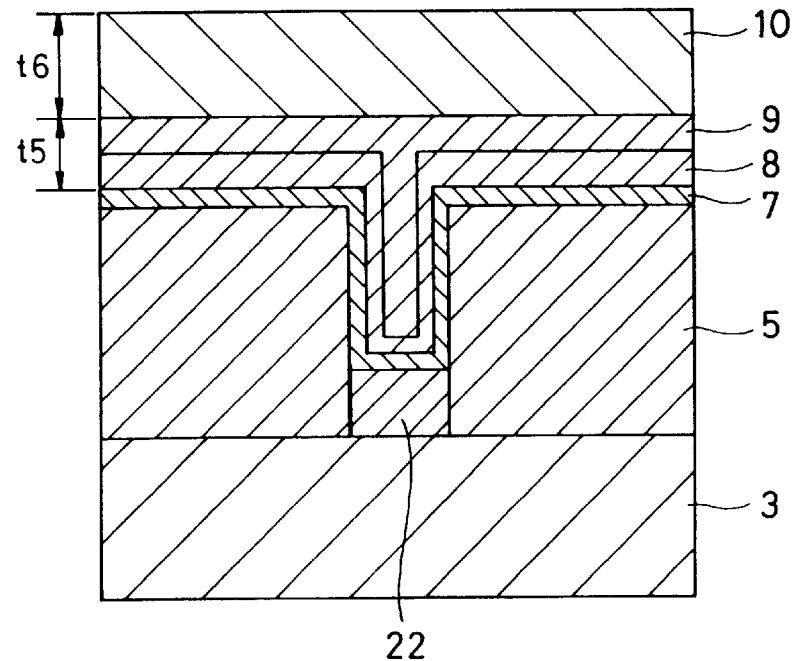
FIG. 12 is a section showing the second embodiment of a fabrication process of a semiconductor device according to the present invention.

Next, referring to FIG. 12, with applying an RF (high frequency) bias or a DC (direct current) bias to the silicon substrate 1 and irradiating an argon ion onto the sputter growth surface, a Cu (bias sputtered Cu layer) 10 is deposited in a film thickness of t6. The film thickness t6 is selected to be greater than t5 (t6>t5). Next, referring to FIG. 13, for crystal control, heat treatment is performed under argon (Ar) or nitrogen (N) atmosphere. At this time, crystal orientation is changed to Cu(200), and, at the same time, Cu film 11 having giant grain of several hundreds μm is formed. Next, referring to FIG. 14, by dry etching of the Cu film 11, a Cu wiring 23 is formed.

Figure 13:
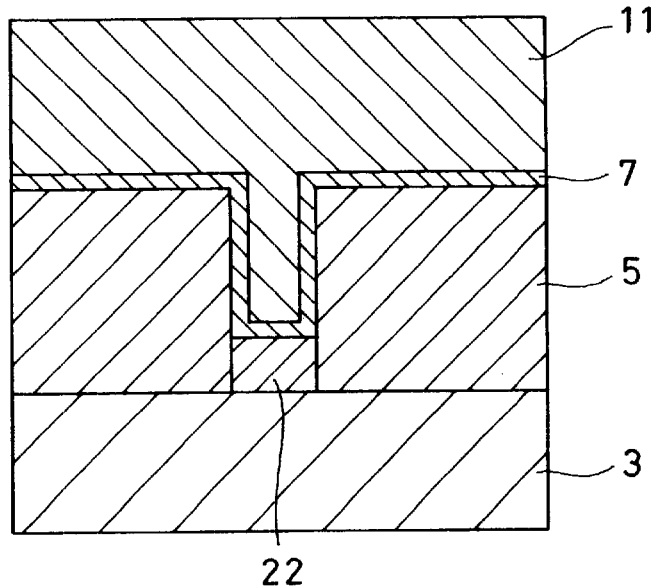
FIG. 13 is a section showing the second embodiment of a fabrication process of a semiconductor device according to the present invention.
Figure 14:
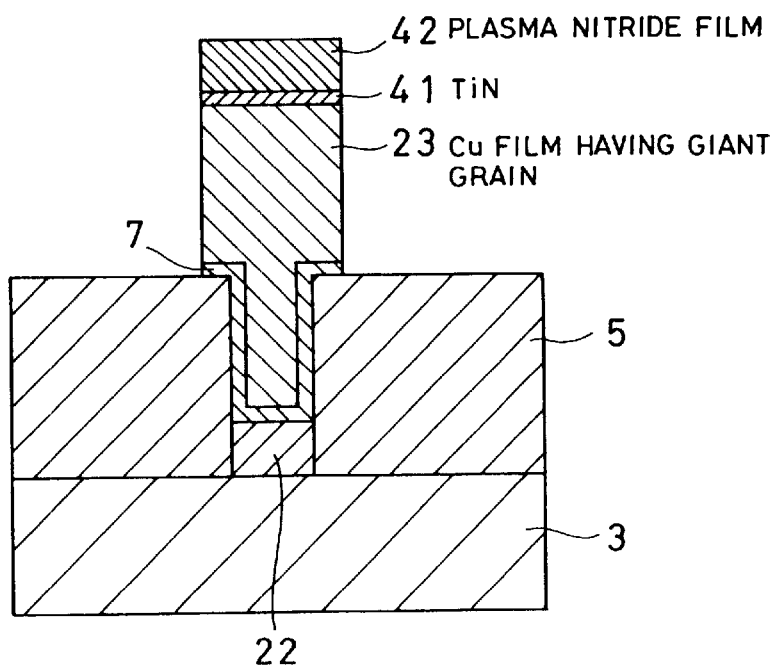
FIG. 14 is a section showing the second embodiment of a fabrication process of a semiconductor device according to the present invention.

Similarly to the first embodiment, novel portion in the first embodiment set forth above, is to deposit Cu 10 having a film thickness greater than or equal to a plated film thickness with applying the RF or DC bias to the silicon substrate 1 and irradiating argon ion onto a sputter growth surface (see FIG. 12), after deposition of Cu 9 by electrolytic plating (see FIG. 11) and before performing heat treatment for crystal control (see FIG. 13).

Figure 15:
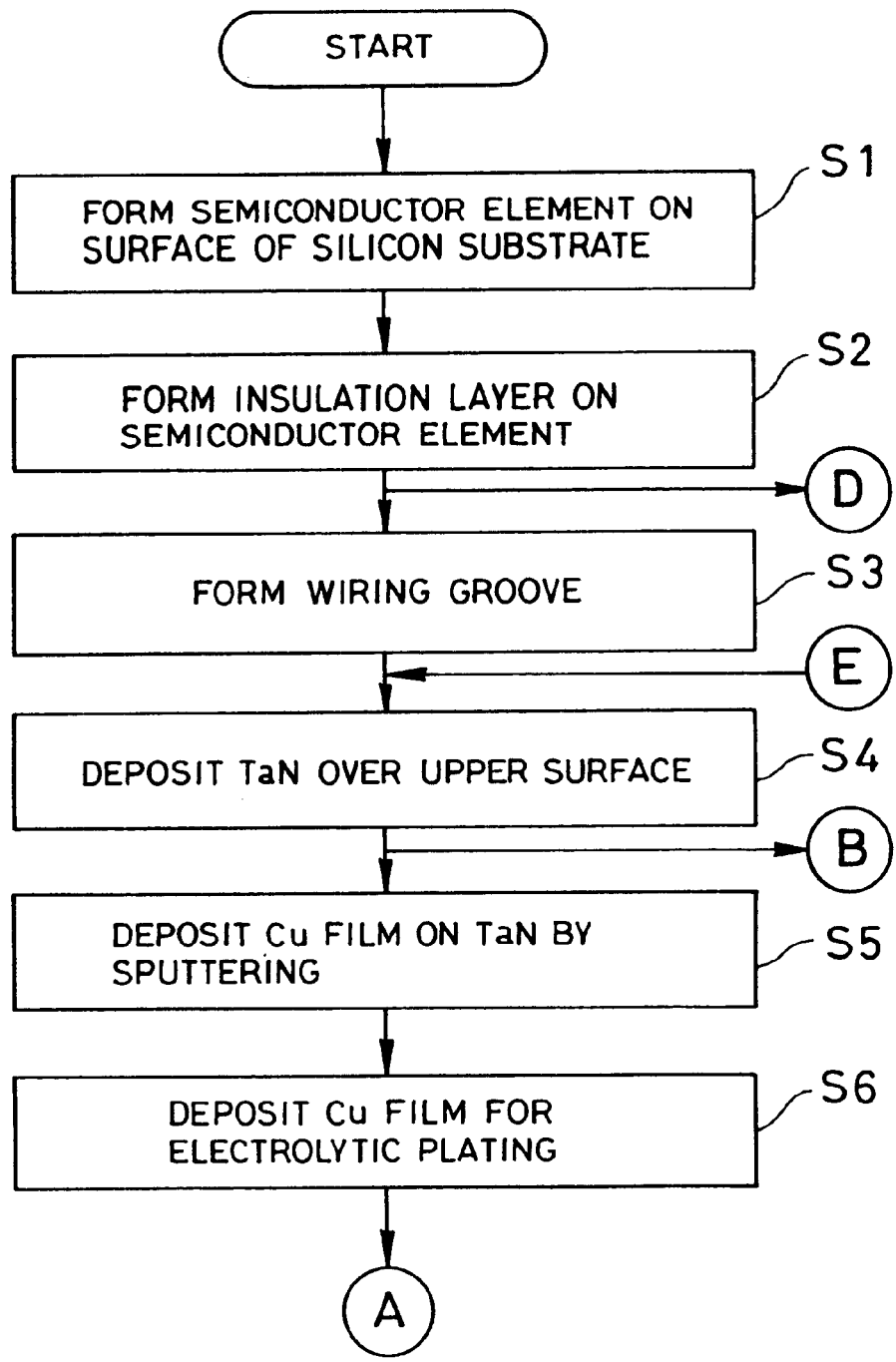
FIG. 15 is a flowchart showing the first particular embodiment of the fabrication process of the semiconductor device according to the present invention.
Figure 16:
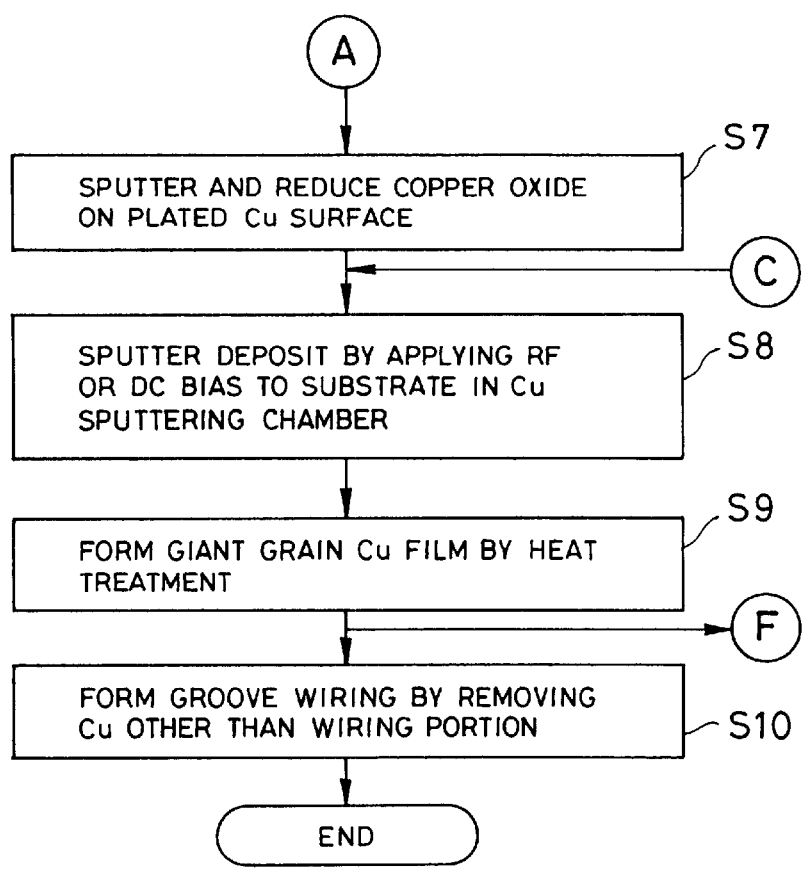
FIG. 16 is a flowchart showing the first particular embodiment of the fabrication process of the semiconductor device according to the present invention.

Next, the first particular embodiment of the fabrication process will be discussed with reference to FIGS. 1 to 5 and further to FIGS. 15 and 16. FIGS. 15 and 16 are flowcharts showing the first particular embodiment of the fabrication process of the semiconductor device according to the present invention. The first particular embodiment is the embodiment Which discusses the first embodiment set forth above more particularly.

At first, as shown in FIG. 1, the semiconductor element forming surface 2 is formed on a silicon substrate 1 (step S1). Then, the insulation film 3 is formed on the semiconductor element forming surface 2, the stopper film 4 is formed on the insulation film 31 and the interlayer insulation film 5 is formed on the stopper film 4 (step S2). The wiring groove 6 is formed in the interlayer insulation film 5 (step S3).

Next, referring to FIG. 2, on an upper surface of the interlayer insulation film 5 and bottom surface and side surface of the wiring groove 6, TaN (layer thickness is 15 nm, for example) 7 as barrier metal is formed by sputtering (step S4). Thereafter, as the Cu seed layer, Cu film 8 of 100 nm thick, for example, is continuously formed on the barrier layer 7 as pre-plating layer by sputtering (step S5). Then, the electrolytically plated Cu film 9 of 500 nm thick, for example, is formed (step S6). At this time, crystal orientation of the Cu films of the seed layer 8 and the plated layer 9 are Cu(111). Next, as shown in FIG. 3, in a cleaning chamber, copper oxide on the surface of the plated Cu 9 is sputtered and reduced by Ar/H$_2$ plasma at room temperature (step S7).

Next, without exposing to the atmospheric air, in the Cu sputtering chamber, with applying the RF (high frequency) bias or a DC (direct current) bias to the silicon substrate 1 and irradiating an argon ion onto a sputter growth surface, Cu is sputtered (step S8). Thus, bias sputter Cu layer 10 is formed on the plated Cu 9. At this time, an ion energy (plasma potential, namely self-bias) of argon is 80 eV. The film thickness (t2) is selected to be 700 nm which is thicker than the total film thickness (t1) of the electrolytically plated Cu 9 and the Cu seed layer 8. Namely, t2>t1 is achieved. On the other hand, the silicon substrate 1 is set at −5° C. for preventing elevation of temperature by irradiation of plasma during deposition.

Next, referring to FIG. 4, the heat treatment at a temperature 400° C. for 30 minutes under argon (Ar) atmosphere is performed. At this time, crystal orientation is changed from Cu(111) to Cu(200). At the same time, Cu film 11 having giant grain of several hundreds μm is successfully formed (step S9). Next, referring to FIG. 5, by mechanical chemical polishing (CMP), Cu other than wiring portion is removed to form a Cu groove wiring 12 (step S10). The electromigration resistance of the groove wiring thus formed has a life several tens times longer than that obtained by heat treatment for the normal plated Cu.

Figure 17:
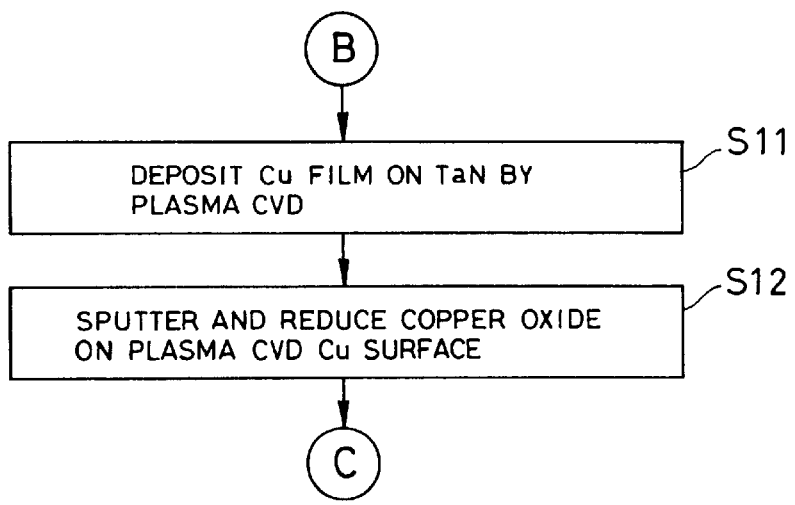
FIG. 17 is a flowchart showing the second particular embodiment of the fabrication process of the semiconductor device according to the present invention.
Figure 18:
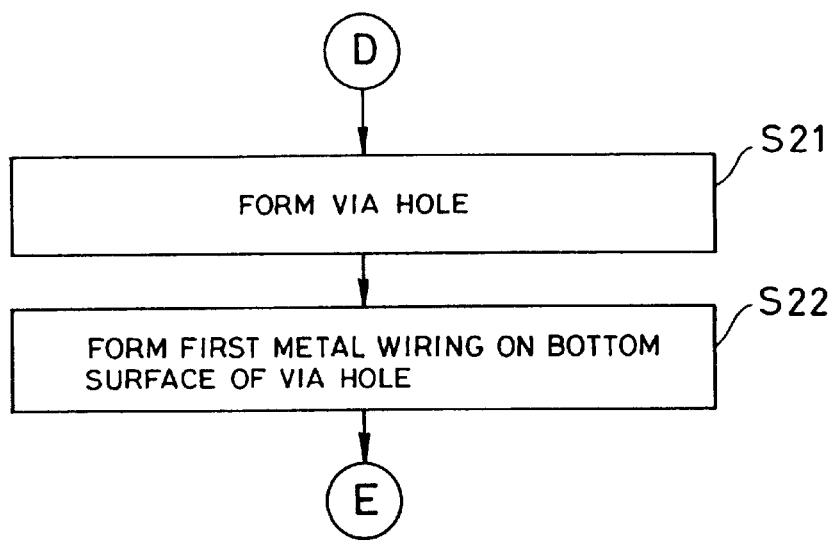
FIG. 18 is a flowchart showing the third particular embodiment of the fabrication process of the semiconductor device according to the present invention.
Figure 19:
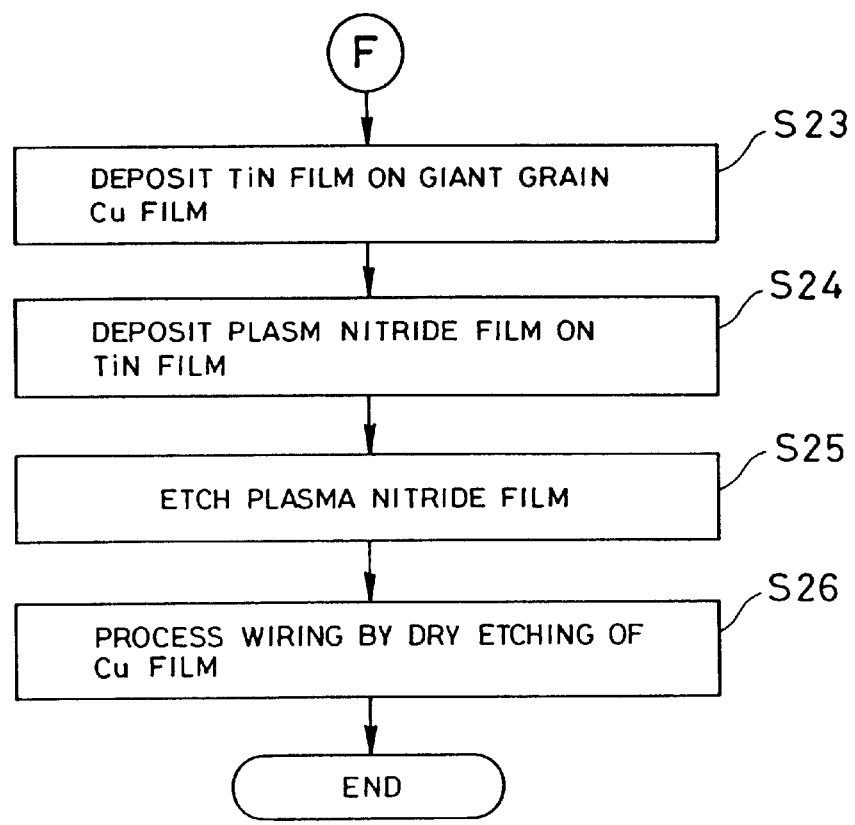
FIG. 19 is a flowchart showing the third particular embodiment of the fabrication process of the semiconductor device according to the present invention.

Next, the second particular embodiment of the fabrication process will be discussed with reference to FIGS. 6 to 9 and further to FIGS. 15, 16 and 17. FIGS. 6 to 9 are sections showing the second particular embodiment of the fabrication process of the semiconductor device according to the present invention, and FIGS. 15, 16 and 17 are flowcharts showing the second-particular embodiment of the fabrication process of the semiconductor device according to the present invention. It should be noted that in FIGS. 6 to 9, the same components common to those in FIGS. 1 to 5 will be identified by the same reference numerals and discussion for such common components will be omitted for avoiding redundant disclosure and keeping the disclosure simple enough to facilitate clear understanding of the present invention. Also, in FIGS. 6 to 9, disclosure of the substrate 1 and the semiconductor element forming surface 2 is omitted. The second particular embodiment is the embodiment which discusses the first embodiment set forth above more particularly as the first particular embodiment.

In the foregoing first particular embodiment, discussion will be given for the case where the wiring groove is buried using the electrolytically plated Cu 9. As discussed in this particular embodiment, Cu may be deposited by way of plasma CVD in place of the electrolytically plated Cu 9. In this case, it is not necessary to form the seed layer 8 by sputtering.

Figure 6:
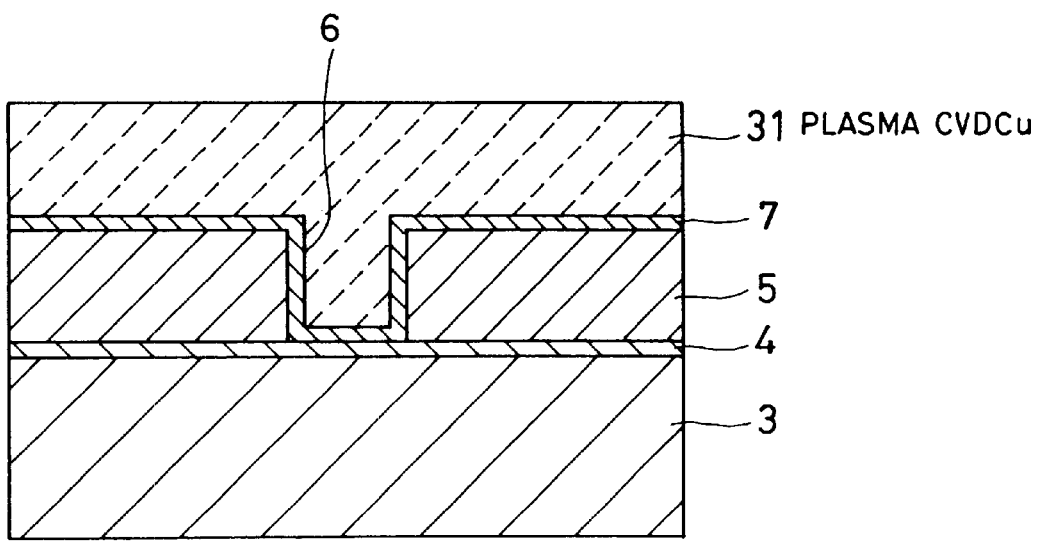
FIG. 6 is a section showing the second particular embodiment of a fabrication process of a semiconductor device according to the present invention.

Since the processes from formation of the semiconductor element forming surface 2 on the silicon substrate 1 (step S1) to formation of TaN (step S4) are the same as the first particular embodiment, discussion for these process steps are omitted. Referring to FIG. 6, after formation of TaN 7 as barrier metal (step S4), by way of plasma CVD, Cu film 31 of 500 nm thick, for example, is deposited on the TaN 7 to be buried in the wiring groove 6 (step S11). At this time, crystal orientation of the Cu film 31 is Cu(111).

Figure 7:
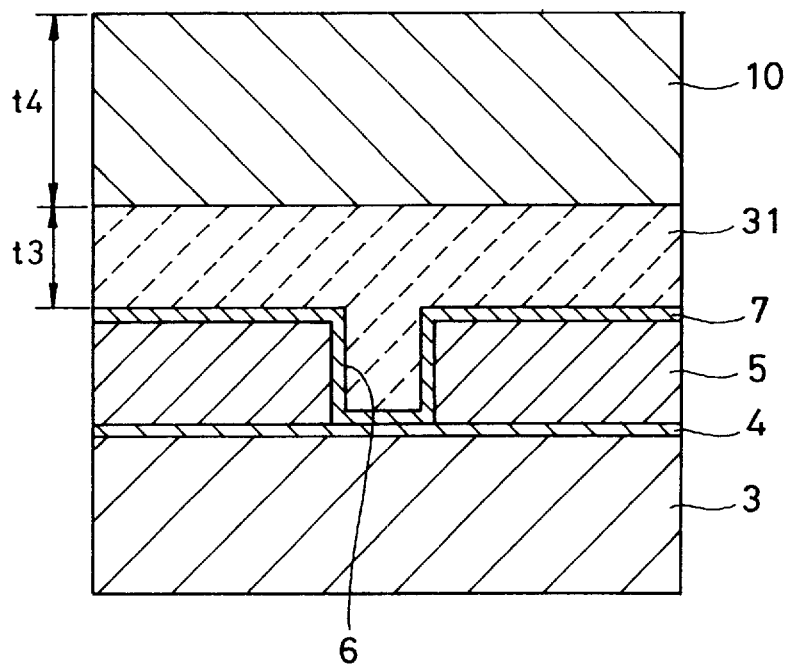
FIG. 7 is a section showing the second particular embodiment of a fabrication process of a semiconductor device according to the present invention.

Next, similarly to the first particular embodiment, as shown in FIG. 7, in a cleaning chamber, copper oxide on the surface of the Cu film (plasma CVD Cu) 31 is sputtered and reduced by copper oxide at room temperature (step S12). Subsequently, without exposing to the atmospheric air, in the Cu sputtering chamber, with applying the RF bias or a DC bias to the silicon substrate 1 and irradiating an argon ion onto a sputter growth surface, Cu is sputtered (step S8). As a result, bias sputter Cu layer 10 is formed on the plasma CVD Cu 31. At this time, an ion energy (plasma potential, namely self-bias) of argon is 80 eV. The film thickness (t4) is selected to be 700 nm which is thicker than the total film thickness (t3) of the plasma CVD Cu 31. Namely, t4>t3 is achieved. On the other hand, the silicon substrate is set at −5° C. for preventing elevation of temperature by irradiation of plasma during deposition.

Figure 8:
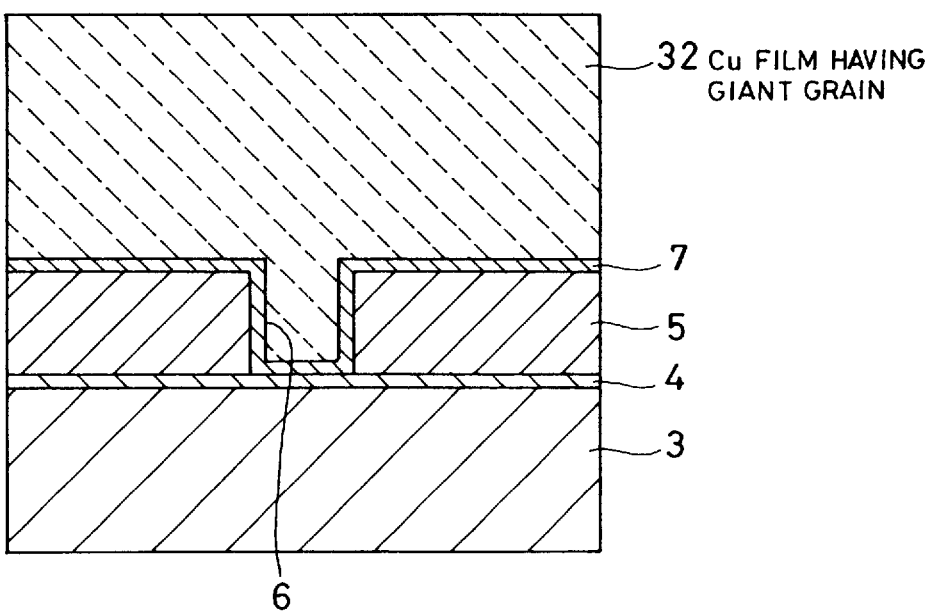
FIG. 8 is a section showing the second particular embodiment of a fabrication process of a semiconductor device according to the present invention.
Figure 9:
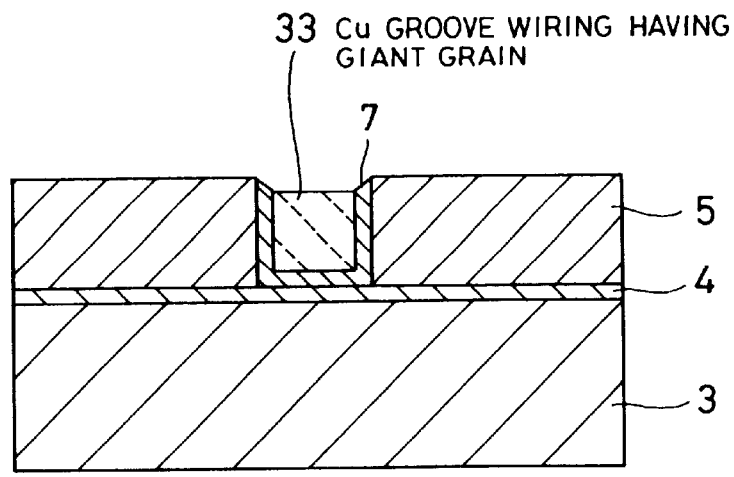
FIG. 9 is a section showing the second particular embodiment of a fabrication process of a semiconductor device according to the present invention.

Next, referring to FIG. 8, the heat treatment at a temperature 400° C. for 30 minutes under argon (Ar) atmosphere is performed. At this time, crystal orientation is changed from Cu(111) to Cu(200). At the same time, Cu film 11 having giant grain of several hundreds μm is successfully formed (step S9). Next, referring to FIG. 9, by mechanical chemical polishing (CMP), Cu other than wiring portion is removed to form a Cu groove wiring 33 (step S10). The electromigration resistance of the groove wiring thus formed has a life several tens times longer than that obtained by heat treatment for the normal plated Cu.

Next, the third particular embodiment of the fabrication process will be discussed with reference to FIGS. 10 to 14 and further to FIGS. 15, 16, 18 and 19. FIGS. 10 to 14 are sections showing the third particular embodiment of the fabrication process of the semiconductor device according to the present invention, and FIGS. 15, 16, 18 and 19 are flowcharts showing the third embodiment of the fabrication process of the semiconductor device according to the present invention. The third particular embodiment is the embodiment which discusses the second embodiment set forth above more particularly.

In the foregoing first and second particular embodiments, discussion is be given for the case where the groove wiring Cu 12 and 33, the present invention is applicable for the case where the wiring is formed by dry etching. As shown in FIG. 10, at first, the semiconductor element forming surface 2 is formed on the surface of the silicon substrate 1 (step S1). Then, the insulation film 3 is formed on the semiconductor element forming surface 2, and the interlayer insulation film 5 is formed on the insulation film 3 (step S2). The via hole 21 is formed in the interlayer insulation film 5 (step S21). Next, on the bottom surface of the via hole 31, a first metal wiring 22 is formed (step S22). Then, similarly to the first and second particular embodiments, the barrier metal film (TaN) 7, the Cu seed film 8 and the plated Cu film 9 are deposited in sequential order.

Figure 11:
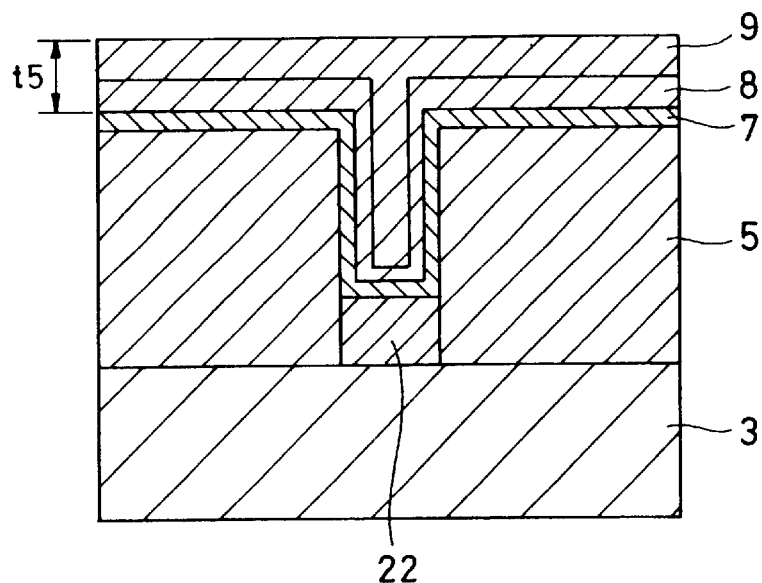
FIG. 11 is a section showing the second embodiment of a fabrication process of a semiconductor device according to the present invention.

At first, as shown in FIG. 11, on an upper surface of the interlayer insulation film 5 and bottom surface and side surface of the wiring groove 6, TaN (layer thickness is 15 nm, for example) 7 as barrier metal is formed (step S4). Thereafter, as the Cu seed layer before plating, Cu film 8 of 100 nm thick, for example, is continuously formed by sputtering (step S5). Then, the electrolytically plated Cu film 9 of 500 nm thick, for example, is formed (step S6). At this time, crystal orientation of the Cu films of the seed layer 8 and the plated layer 9 are Cu(111).

Then, similarly to the first and second particular embodiments, Cu film 10 is deposited with applying RF or DC bias to the substrate 1. As shown in FIG. 12, in a cleaning chamber, copper oxide on the surface of the plated Cu 9 is sputtered and reduced by Ar/H₂ plasma at room temperature (step S7). Next, without exposing to the atmospheric air, in the Cu sputtering chamber, with applying the RF (high frequency) bias to the silicon substrate 1 and irradiating an argon ion onto a sputter growth surface, Cu is sputtered (step S8). Thus, bias sputter Cu layer 10 is formed on the plated Cu 9. At this time, an ion energy (plasma potential, namely self-bias) of argon is 80 eV. The film thickness (t6) is selected to be 300 nm which is thicker than the total film thickness (t5) of the electrolytically plated Cu 9 and the Cu seed layer 8. Namely, t6>t5 is achieved. On the other hand, the silicon substrate 1 is set at −5° C. for preventing elevation of temperature by irradiation of plasma during deposition, Next, referring to FIG. 13, the heat treatment at a temperature 400° C. for 30 minutes under argon (Ar) atmosphere is performed. At this time, crystal orientation is changed from Cu(111) to Cu(200). At the same time, Cu film 11 having giant grain of several hundreds μm is successfully formed (step S9). Next, as an anti-reflection film for a photolithographic process, TiN film 41 of 50 nm thick is deposited on the Cu film 11 (step S23). Subsequently, a plasma nitride layer 42 is deposited on the TiN film 41 (step S24).

Thereafter, through photolithographic process, the plasma nitride film 42 is etched by a mixture gas containing C₄F₈, Ar and O₂ (step S25). Then, the photo resist is removed by ashing using the O₂ plasma and resist peeling liquid. Next, using a mixture gas of SiCl₄, Ar, N₂ and NH₃, Cu film 11 is dry etched to form a Cu film 23 of giant grain (step S26). Thus, monocrystalline Cu wiring is successfully formed. Thus, The electromigration resistance of the Cu wiring is higher than the normal plated Cu wiring in several tens times.

Namely, according to the present invention, by heat treatment, crystal orientation is varied in the bias sputter layer and giant grain is grown. At the same time, phenomenon to cause giant grain growth is also caused in the electrolytically plated layer as set out in the publication 2 is caused. Thus, monocrystalline Cu wiring having no grain boundary can be formed in the wiring and the groove wiring. Thus, lowering of resistance and improvement of electromigration resistance in the wiring can be achieved.

As set forth above, according to the present invention, since the fabrication process of a semiconductor device, in which wiring is formed on the semiconductor substrate, comprises a first step of depositing a first conductive film on said substrate via an insulation film, a second step, subsequent to said first step, of depositing a second conductive film having film thickness thicker than the film thickness of said first conductive film, on said first conductive film, a third step following said second step, of performing heat treatment at least for said first and second conductive films, and a fourth step following said third step, of forming wiring by shaping said conductive films after said heat treatment to permit burying Cu within the wiring groove with sufficiently large grain size.

Particularly, by heat treatment, variation of crystal orientation and growth of giant grain is caused in the second conductive film, and, at the same time, growth of the giant grain is caused even in the first conductive film. By this, monocrystalline wiring with no grain boundary can be formed in the wiring groove. This lowering of resistance and improvement of electromigration resistance of the wiring can be achieved.

Although the present invention has been illustrated and described with respect to exemplary embodiments thereof, it should be understood by those skilled in the art that the foregoing and various changes, emission and additions may be made therein and thereto, without departing from the spirit and scope of the present invention. Therefore, the present invention should not be understood as limited to the specific embodiment set out above but to include all possible embodiments which can be embodied within a scope encompassed and equivalent thereof with respect to the feature set out in the appended claims.

For instance, while TaN is employed as metallic material for the barrier metal layer, the material is not limited to TaN but can be Ta, TiN, Mo, Nb, W and nitride thereof. Also, as a material of the interlayer insulation layer defining the wiring groove, plasma CVD oxide is used in the shown embodiment. However, the material for the interlayer insulation layer may be hydrogen silisesquioxane (HSQ) film, organic SOG, amorphous carbon material and fluoridation thereof.

What is claimed is:

1. A fabrication process of a semiconductor device, in which wiring is formed on the semiconductor substrate, comprising:

depositing a first conductive film on said substrate via an insulation film;

depositing a second conductive film having film thickness thicker than the film thickness of said first conductive film, on said first conductive film;

performing heat treatment at least for said first and second conductive films; and forming wiring by shaping said conducting films after said heat treatment.

2. A fabrication process of a semiconductor device as set forth in claim 1, wherein a groove for burying wiring is formed in said insulation film.

3. A fabrication process of a semiconductor device as set forth in claim 1, wherein said first step comprises:

a first sub-step of depositing a first sub-layer by sputtering; and a second sub-step following said first sub-step of depositing a second sub-layer on said first sub-layer by an electrolytic plating, for forming said first conductive film with said first sub-layer and said second sub-layer.

4. A fabrication process of a semiconductor device as set forth in claim 1, wherein said first conductive film is deposited in said first step by plasma CVD.

5. A fabrication process of a semiconductor device as set forth in claim 1, wherein said second step comprises:

a first sub-step of sputtering and reducing oxide on a surface of said first conductive film; and a second sub-step following said first sub-step, of applying bias to said semiconductor substrate and irradiating argon gas onto a growth surface within a sputtering chamber.

6. A fabrication process of a semiconductor device as set forth in claim 1, wherein said third step is performed a heat treatment at a given temperature and a given period under argon atmosphere.

7. A fabrication process of a semiconductor device as set forth in claim 1, wherein said fourth step is performed for forming a groove wiring by removing a conductive film other than wiring portion by a mechanical chemical polishing.

8. A fabrication process of a semiconductor device as set forth in claim 1, wherein a via hole is formed in said insulation film.

9. A fabrication process of a semiconductor device as set forth in claim 8, wherein said first step comprises:

a first sub-step of depositing a first sub-layer by puttering; and a second sub-step following said first sub-step of depositing a second sub-layer on said first sub-layer by an electrolytic plating, for forming said first conductive film with said first sub-layer and said second sub-layer.

10. A fabrication process of a semiconductor device as set forth in claim 8, wherein said second step comprises:

a first sub-step of sputtering and reducing oxide on a surface of said first conductive film; and a second sub-step following said first sub-step, of applying bias to said semiconductor substrate and irradiating argon gas onto a growth surface within a sputtering chamber.

11. A fabrication process of a semiconductor device as set forth in claim 8, wherein said third step is performed a heat treatment at a given temperature and a given period under argon atmosphere.

12. A fabrication process of a semiconductor device as set forth in claim 8, wherein said fourth step performing wiring process by dry etching of the conductive film.

13. A fabrication process of a semiconductor device as set forth in claim 8, wherein said conductive film is formed by copper.

14. A fabrication process of a semiconductor device, in which wiring is formed on the semiconductor substrate, comprising:

depositing a first conductive film on said substrate via an insulation film, wherein the first conductive layer is buried to seal a top of a contact via;

depositing a second conductive film having film thickness thicker than the film thickness of said first conductive film, on said first conductive film;

performing heat treatment at least for said first and second conductive films; and forming wiring by shaping said conducting films after said heat treatment.

15. A fabrication process of a semiconductor device, in which wiring is formed on the semiconductor substrate, comprising:

depositing a first conductive film on said substrate via an insulation film;

depositing a second conductive film having film thickness thicker than the film thickness of said first conductive film, on said first conductive film by applying a high frequency (RF) bias to the semiconductor substrate;

performing heat treatment at least for said first and second conductive films; and forming wiring by shaping said conducting films after said heat treatment.

* * * * *